(12) United States Patent
Tsan et al.

(10) Patent No.: US 6,399,522 B1
(45) Date of Patent: Jun. 4, 2002

(54) PE-SILANE OXIDE PARTICLE PERFORMANCE IMPROVEMENT

(75) Inventors: Chun-Ching Tsan, Tou-Liu; Hung-Ju Chien, Hsin-Chu; Chun-Chang Chen, Taly; Ying-Lang Wang, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/075,115

(22) Filed: May 11, 1998

(51) Int. Cl.$^7$ .................. H01L 21/31; H01L 21/469
(52) U.S. Cl. ...................................... 438/788; 438/787
(58) Field of Search ................................ 438/787, 788

(56) References Cited

U.S. PATENT DOCUMENTS 5,576,076 A  11/1996 Slootman et al. ............ 427/579

*Primary Examiner*—Alexander G. Ghyka
(74) *Attorney, Agent, or Firm*—George O. Saile; Stephen B. Ackerman; Rosemary L. S. Pike

(57) ABSTRACT

A method of forming a PE-silane oxide layer with a greatly reduced particle count is described. A semiconductor substrate is provided over which a silicon oxide film is to be formed. The silicon oxide film is formed by the steps of: 1) pre-flowing a non-silane gas into a deposition chamber for at least two seconds whereby the pre-flowing step prevents formation of particles on the silicon oxide film, and 2) thereafter depositing a silicon oxide film by chemical vapor deposition by flowing a silane gas into the deposition chamber to complete formation of a silicon oxide film using plasma-enhanced chemical vapor deposition in the fabrication of an integrated circuit.

16 Claims, 2 Drawing Sheets

PE-SILANE OXIDE PARTICLE PERFORMANCE IMPROVEMENT

BACKGROUND OF THE INVENTION

(1) Field of the Invention

The present invention relates to the fabrication of integrated circuit devices, and more particularly, to a method of reducing the number of particles formed on a wafer during PE-silane oxide film formation in the fabrication of integrated circuits.

(2) Description of the Prior Art

Silicon oxide films are widely used in semiconductor processing as interlevel and intermetal dielectrics. Silicon oxide films are often formed by plasma-enhanced chemical vapor deposition (PECVD). FIG. 1 illustrates a typical CVD chamber 20. The wafer is placed into the chamber. Gases are flowed into the chamber whereby the silicon oxide film is formed on the surface of the wafer. Typically, silane ($SiH_4$) is flowed from the Mass Flow Controller (MFC) of one gas inlet 22 while $N_2O$ is flowed from the MFC of a second gas inlet 24. The reaction of the two gases forms $SiO_2$.

In the typical silicon oxide PE-silane reaction, the $SiH_4$ and $N_2O$ gases are flowed into the CVD chamber with no radio frequency power as a stabilization step. Then the radio frequency, for example 280 watts, is applied while the two gases continue to flow to form the silicon oxide film.

After the silicon oxide film was formed according to the conventional recipe, the inventors obtained a particle count on the wafer. Unexpectedly, they found an extremely high particle count of more than 20,000 particles of a size 0.2 $\mu$m and larger. It is desirable to find a method of forming a silicon oxide film without this extremely high particle count.

U.S. Pat. No. 5,279,865 to Chebi et al teaches a method of forming a silicon oxide layer using silane flow. U.S. Pat. No. 5,525,550 to Kato teaches a method of forming silicon oxide by CVD using silane and water as the main feed gases. U.S. Pat. No. 5,576,076 to Slootman et al teaches forming an silicon dioxide layer by subjecting a wafer to an electrical discharge in the presence of silane and $N_2O$. U.S. Pat. No. 5,214,952 to Leggett et al teaches the use of a series of highly accurate mass flow controllers to deliver a high purity calibration gas mixture to a gas analyzer. None of these references address the particle problem.

SUMMARY OF THE INVENTION

Accordingly, it is a primary object of the invention to provide a process for greatly reducing the particle count in the formation of a PE-silane oxide film.

In accordance with the object of the invention, a method of forming a PE-silane oxide layer with a greatly reduced particle count is achieved. A semiconductor substrate is provided over which a silicon oxide film is to be formed. The silicon oxide film is formed by the steps of: 1) pre-flowing a non-silane gas into a deposition chamber for at least two seconds whereby the pre-flowing step prevents formation of particles on the silicon oxide film, and 2) thereafter depositing a silicon oxide film by chemical vapor deposition by flowing a silane gas into the deposition chamber to complete formation of a silicon oxide film using plasma-enhanced chemical vapor deposition in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
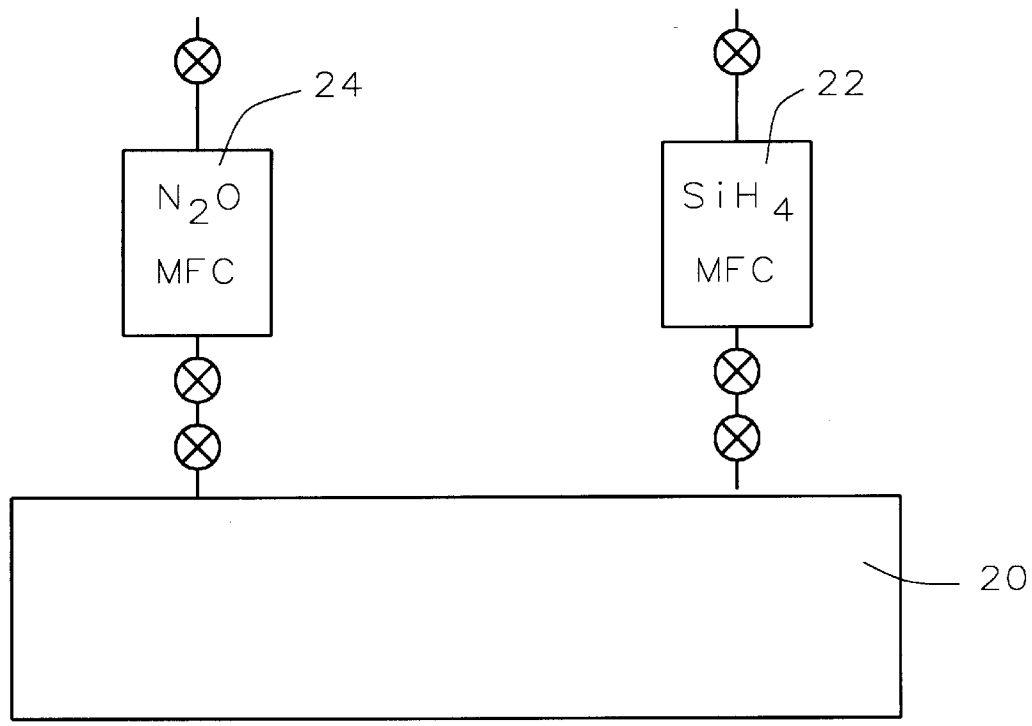
FIG. 1 is a cross-sectional representation of chemical deposition chamber.
Figure 2:
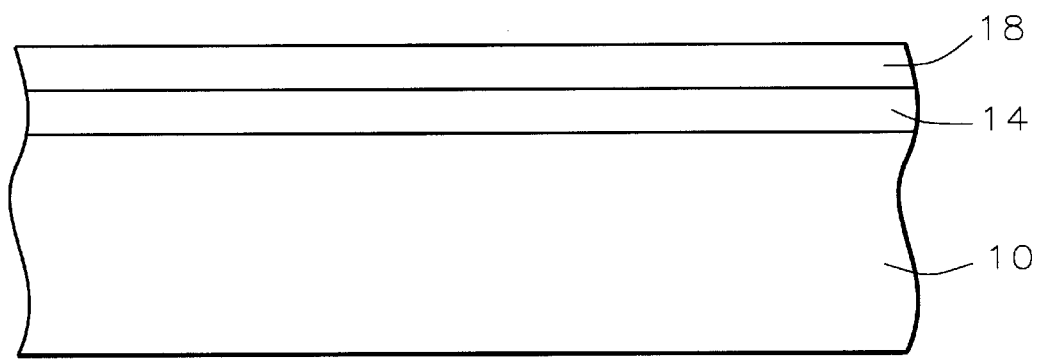
FIG. 2 is a cross-sectional representation of an embodiment of the present invention.

Referring now more particularly to FIG. 2, there is shown a semiconductor substrate 10, preferably composed of monocrystalline silicon. Semiconductor device structures, not shown, may be formed in and on the semiconductor substrate, such as in layer 14. Alternatively, layer 14 may be a metal layer. An interlevel or intermetal dielectric layer 18 of silicon dioxide is to be formed by plasma-enhanced chemical vapor deposition (PECVD) overlying layer 14.

The inventors conducted a series of tests to determine the cause of the particle spiking observed after conventional PECVD silicon dioxide film deposition and to determine a solution to this problem. First, the inventors conducted a hardware check of the transfer mechanism and the gas flow inlets. These tests showed a particle count of less than 10 each. Next, the inventors checked the reaction parameters of the deposition step. Particle counts of greater than 20,000 were found after $SiH_4+N_2O$ gas flow and after $SiH_4$ gas flow without $N_2O$. However, a particle count of less than 10 was found after a gas flow of $N_2O$ without $SiH_4$.

The inventors have determined a possible mechanism for the particle formation sequence. Excess $SiH_4$ is flowed into the chamber due to overshooting or bad timing by the Mass Flow Controller (MFC). The $SiH_4$ is adsorbed by the wafer surface. Abnormal nucleation sites are formed by the $SiH_4$ on the wafer surface resulting in the particle spiking disaster observed by the inventors.

The solution found by the inventors is a simple and ingenious one. The abnormal nucleation sites can be reduced by adding a non-$SiH_4$ gas pre-flow before stabilization. This will result in good nucleation sites and good particle performance.

Figure 3:
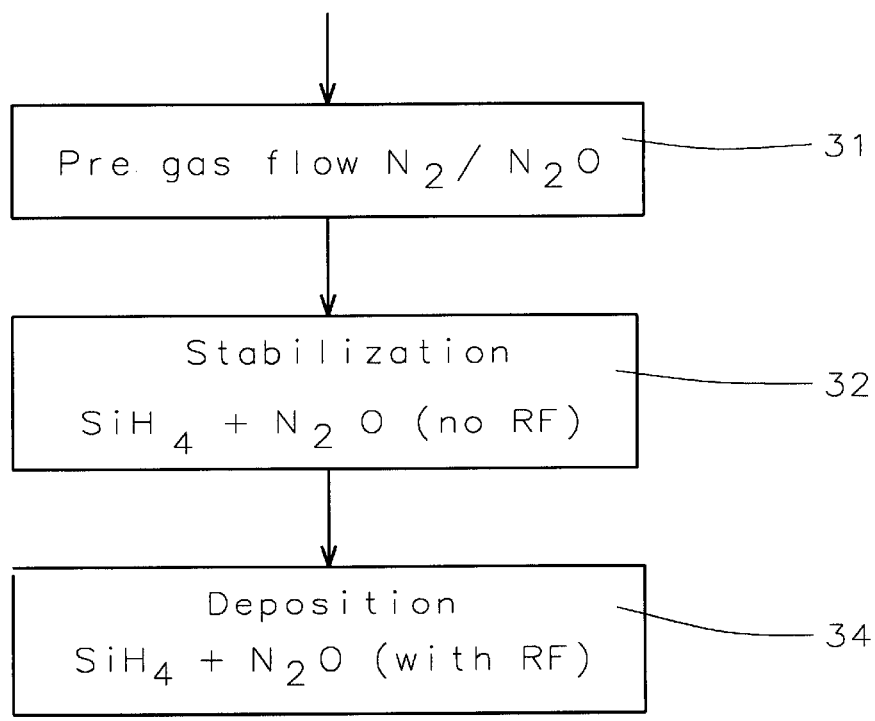
FIG. 3 is a flow chart of the process flow of a first embodiment of the present invention.

FIG. 3 illustrates the process flow of the first preferred embodiment of the present invention. Steps 32 and 34 are the conventional stabilization and deposition steps. Step 31 is the new non-$SiH_4$ gas pre-flow step of the present invention. $N_2O$ and/or $N_2$ gas should be flowed for at least 2 seconds before the conventional stabilization step. It has been found that $N_2O$ and/or $N_2$ plasma works as well as gas.

EXAMPLE

The following Example is given to show the important features of the invention and to aid in the understanding thereof. Variations may be made by one skilled in the art without departing from the spirit and scope of the invention.

The following table summarizes the results of testing various gas flow rates and times for the new pre-flow step of the invention along with the resulting particle counts.

TABLE 1

| Condition | | Particles |
|---|---|---|
| 1. $N_2O$ gas | (1400 sccm, 30 sec) + stabl + dep | 13 |
| 2. $N_2O$ gas | (1400 sccm, 2 sec) + stabl + dep | 2 |
| 3. $N_2O$ gas | (1100 sccm, 10 sec) + dep | 1 |
| 4. $N_2O$ gas | (1100 sccm, 2 sec) + stabl + dep | 2 |
| 5. $N_2$ gas | (1100 sccm, 10 sec) + stabl + dep | 3 |
| 6. $N_2O$ gas | (3000 sccm) + $N_2$ gas (360 sccm) + stabl + dep | |
| 7. New stabl: | ($N_2$ 1100 sccm + $SiH_4$ 115 sccm, 10 sec) + dep | 3 |

It can be seen from Table 1 that the pre-flow step of the present invention drastically reduces the particle count from over 20,000 to less than 15, and in most cases, to 3 or fewer. $N_2O$ gas was flowed at 1400 and 1100 sccm for 2, 10, or 30 seconds. In one case (3), the pre-flow step was performed followed immediately by deposition without the stabilization step. However, without the stabilization step, the thickness of the resulting film may be unstable. $N_2$ pre-flow was also satisfactory alone (5) or in combination with $N_2O$ (6).

The last table entry (7) refers to the second embodiment of the present invention. This is a new stabilization step including $N_2$ and $SiH_4$ flow before the $N_2O$ and $SiH_4$ deposition step. The particle counts were also satisfactory for this case.

Figure 4:
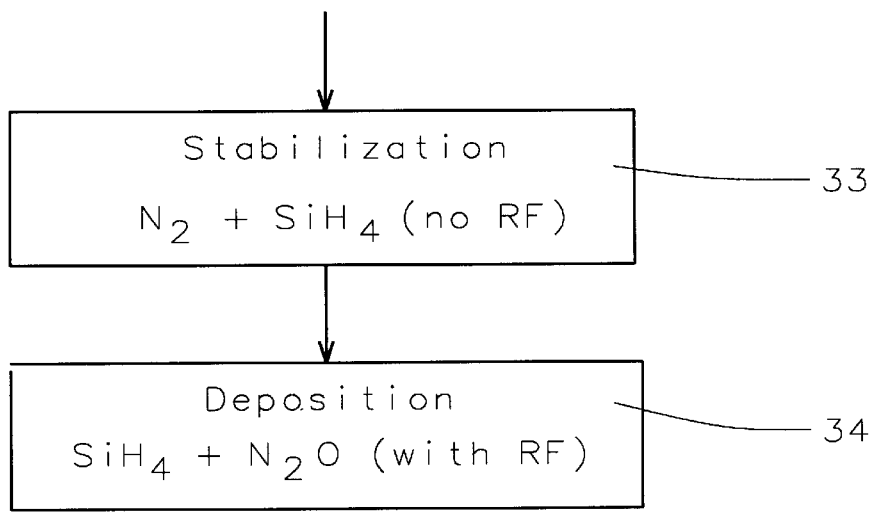
FIG. 4 is a flow chart of the process flow of a second embodiment of the present invention.

FIG. 4 illustrates the process flow of the second preferred embodiment of the present invention. Step 34 is the conventional deposition step. Step 33 is the new stabilization step of the present invention. $N_2$ and $SiH_4$ gases are flowed together in the new stabilization step.

The process of the present invention provides a method of PE-silane oxide deposition with dramatically reduced particle counts. The inventive process in the first embodiment is a pre-flow step inserted before the $N_2O+SiH_4$ stabilization step. $N_2O$ gas or $N_2$ gas, or a combination of the two, is flowed, preferably for at least 2 seconds. The flow rate of the gases is preferred to be the same as the flow rate of the $N_2O$ gas in the deposition step.

In an alternative according to the second embodiment, a new stabilization step is inserted in place of the $N_2O+SiH_4$ stabilization step. The new step flows $N_2$ gas and $SiH_4$ gas using no radio frequency followed by conventional deposition Particle performance was found to be good when this new stabilization step was substituted for the conventional stabilization step. It is surmised that the N2 and SiH4 gases together changed the nucleation conditions.

Both embodiments of the present invention are simple and effective methods of providing dramatically reduced particle counts. However, to keep film thickness and film quality the same as in the conventional process, it is preferred to use the first embodiment of the invention in which a non-silane gas pre-flow step is used before the conventional stabilization and deposition steps.

While the invention has been particularly shown and described with reference to the preferred embodiments thereof, it will be understood by those skilled in the art that various changes in form and details may be made without departing from the spirit and scope of the a invention.

What is claimed is:

1. A method of forming a silicon oxide film using plasma-enhanced chemical vapor deposition in the fabrication of an integrated circuit comprising:

providing a semiconductor substrate over which said silicon oxide film is to be formed; and forming said silicon oxide film by the steps of:

1) pre-flowing a non-silane gas into a deposition chamber for at least two seconds; wherein a silane gas is not present; and 2) thereafter depositing said silicon oxide film by chemical vapor deposition by flowing a silane gas into said deposition chamber to complete said formation of said silicon oxide film using plasma-enhanced chemical vapor deposition in the fabrication of said integrated circuit.

2. A method according to claim 1 wherein said non-silane gas comprises $N_2O$.

3. A method according to claim 1 wherein said non-silane gas comprises $N_2$.

4. A method according to claim 1 wherein said non-silane gas comprises $N_2O$ and $N_2$.

5. A method according to claim 1 wherein said step of depositing said silicon oxide film is preceded by a stabilizing step comprising flowing $N_2O$ and $SiH_4$ gases with a radio frequency of zero.

6. A method according to claim 1 wherein said step of depositing said silicon oxide film comprises flowing $N_2O$ and $SiH_4$ gases with a radio frequency greater than zero.

7. A method according to claim 1 wherein said silane gas comprises $SiH_4$.

8. A method of forming a silicon oxide film using plasma-enhanced chemical vapor deposition in the fabrication of an integrated circuit comprising:

providing a semiconductor substrate over which said silicon oxide film is to be formed; and forming said silicon oxide film by the steps of:

1) flowing only $N_2$ gas and silane gas into a deposition chamber at a radio frequency of zero; and 2) thereafter depositing said silicon oxide film by chemical vapor deposition by flowing $N_2O$ and said silane gas into said deposition chamber at a radio frequency greater than zero to complete said formation of said silicon oxide film using plasma-enhanced chemical vapor deposition in the fabrication of said integrated circuit.

9. A method according to claim 8 wherein said step of flowing said $N_2$ gas and said silane gas comprises a stabilization step.

10. A method according to claim 9 wherein said stabilization step prevents formation of particles on said silicon oxide film.

11. A method according to claim 8 wherein said silane gas comprises $SiH_4$.

12. A method of forming a silicon oxide film using plasma-enhanced chemical vapor deposition in the fabrication of an integrated circuit comprising:

providing a semiconductor substrate over which said silicon oxide film is to be formed; and forming said silicon oxide film by the steps of:

1) pre-flowing a non-silane gas into a deposition chamber for at least two seconds whereby said pre-flowing step prevents formation of particles on said silicon oxide film;

2) thereafter flowing $N_2O$ and a silane gas into said deposition chamber at a radio frequency of zero; and 3) thereafter depositing said silicon oxide film by chemical vapor deposition by flowing said $N_2O$ gas and said silane gas into said deposition chamber at a radio frequency greater than zero to complete said formation of said silicon oxide film using plasma-enhanced chemical vapor deposition in the fabrication of said integrated circuit.

13. A method according to claim 12 wherein said non-silane gas comprises $N_2O$.

14. A method according to claim 12 wherein said non-silane gas comprises $N_2$.

15. A method according to claim 12 wherein said non-silane gas comprises $N_2$ and $N_2O$.

16. A method according to claim 12 wherein said silane gas comprises $SiH_4$.

* * * * *